United States Patent [19]

Mackanic et al.

[11] Patent Number: 4,881,906
[45] Date of Patent: Nov. 21, 1989

[54] METHOD FOR OBTAINING ELECTRICAL INTERCONNECT USING A SOLDERABLE MECHANICAL FASTENER

[75] Inventors: James C. Mackanic, Rocklin; Dawn M. Lelko, Citrus Heights; Steven A. Shugart; James K. Koch, both of Rocklin, all of Calif.

[73] Assignee: Helwett-Packard Company, Palo Alto, Calif.

[21] Appl. No.: 160,390

[22] Filed: Feb. 25, 1988

[51] Int. Cl.⁴ .............................................. H01R 9/09
[52] U.S. Cl. ...................................... 439/83; 29/843; 439/876
[58] Field of Search ............................ 439/55, 82–84, 439/741, 743, 870, 876; 29/839–847; 361/400–406, 409; 228/180.1

[56] References Cited

U.S. PATENT DOCUMENTS

| | | | |
|---|---|---|---|
| 2,756,485 | 7/1956 | Abramson et al. | 29/830 |
| 3,061,911 | 11/1962 | Baker | 29/847 |
| 3,103,547 | 9/1963 | Ansley | 439/83 |
| 3,601,750 | 8/1971 | Mancini | 439/84 |
| 3,621,116 | 11/1971 | Adams | 361/409 |
| 3,825,999 | 7/1974 | Rubey | 29/837 |
| 4,181,385 | 1/1980 | De Santis et al. | 439/83 |
| 4,413,309 | 11/1983 | Takahashi et al. | 361/406 |

OTHER PUBLICATIONS

IBM Bulletin, Stricker et al., vol. 6, No. 3, p. 15, 8–1963.

Primary Examiner—Neil Abrams

[57] ABSTRACT

A method for providing an electrical connection (via) between the top and bottom of a printed circuit board (PCB) is presented. An eyelet extends through a hole in the PCB. The top of the PCB has a first conductive layer. Around the hole the first conductive layer is shaped such that a conductive pad is isolated from the rest of the first conductive layer, except that spokes of the first conductive layer extend from the conductive pad to the rest of the first conductive layer. The eyelet is crimped such that crimped fingers or tabs of the eyelet cause the eyelet to be mechanically retained in the hole. The tabs are curved so that the tabs do not lie flat upon the conductive pad. The bottom of the PCB is then wave soldered so that a base of the eyelet is electrically coupled to a conductive layer on the bottom of the PCB and the tabs are electrically coupled to the conductive pad.

6 Claims, 4 Drawing Sheets

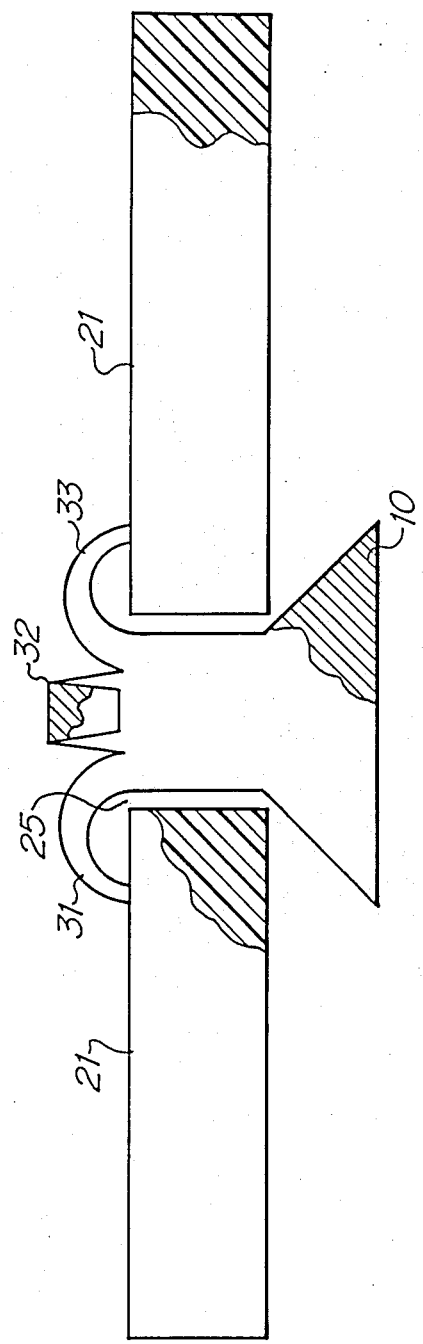

METHOD FOR OBTAINING ELECTRICAL INTERCONNECT USING A SOLDERABLE MECHANICAL FASTENER

BACKGROUND

The present inention has to do withproviding an electrical interconnect betweenthe bottom and the top of a printed circuit board (PCB). such a connection is called a via.

There are various methods for providing an electrical connection between the bottom and top of a PCB in the prior art. For instance, plated through holes provide an effective via; however, this method of providing vias is relatively expensive. Similarly the insertion of a wire jumper through two holes in a PCB and a soldering the wire to the board on both the top and bottom sides is an effective but expensive method of providing via. The wire jumper insertion method requires hand soldering of the PCB and is therefore costly and time consuming.

Eyelets have been used in the prior art. For instance metal eyelets may be swaged into a hole in a PCB. Sometimes a component lead is inserted t hrough the eyelet before soldering. For a conventional eyelet the top side of the PCB must be soldered in a separate operation if a reliable connection through the PCB is desired.

Similarly, commercially available "solder-through" eyelets, that is special eyelets which utilize capillary action to carry molten solder from the bottom side of a PCB eyelet in a single operation. Component leads are inserted through these eyelets before soldering. The eyelets serves the purpose of strengthening the mechanicalconnection of the component to the PCB.

The major drawback of using eyelets for vias in the prior art has been the inability to provide a reliable electrical joint. Thermal expansion due to tmperature cycling often causes joints to crack resulting in elecrical failure.

SUMMARY OF THE INVENTION

In accordance with the preferred embodiment of the present invention a method for providing vias betwee the top and bottom of a two-layered printed circuit board (PCB) is presented. An eyelet extends through a hole in the PCB. The top of the PCB has a first conductive layer. Around the hole the first conductive layer is shaped such that a conductive pad is thermally isolated from the rest of the first conductive layer, except that spokes of the first conductive layer extend from the conductive pad to the rest of the first conductive layer. The thermal isolatio of the conductive pads aids in heat retention during soldering. The eyelet is crimped such that crimped fingers or tabs of the eylet cause the eyelet to be mechanically retained in the hole. The tabs are curved so that the tabs do not lie flat upon the conductive pad. The bottom of the PCB is then wave soldered so that a base of the eyelet is electrically coupled to a second conductive layer on the bottom of the PCB and the tabs are electrically coupled to the conductive pad on the first conductive layer.

BRIEF DESCRIPTION OF THE DRAWINGS

FIG. 3 shows a cross-sectional view of the eyelet shown in FIG. 1, placed in the circuit board shown in FIG. 2.

DESCRIPTION OF THE PREFERRED EMBODIMENT

Figure 1:
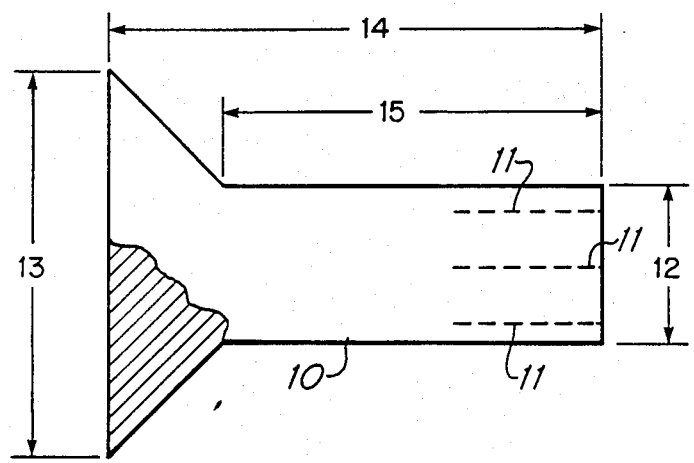
FIG. 1 shows an eyelet used as a mechanical fastener in accordance with the preferred embodiment of the present invention.

FIG. 1 shows an eyelet 10 used to make electrical connection between the top and the bottom of a printed circuit board (PCB). Eyelet 10 is a hollow mechanical fstner made of copper with nickel flash and plated with tin-lead. Eyelet 10 has been pre-scored, that is, grooves 11 are placed in eyelet 10 for easy separation upon crimping. Eyelets, such as eyelet 10 are available commercially, for instance, from Mark Eyelet and Stamping Inc. 63 Wakelee Road, Wolcot, Conn. 07616. Diameter 12 of eyelet 10 is 1.52 millimeters. Diameter 13 of eyelet 10 is 2.41 millimeters. Length 4 of eyelet 10 is 2.87 millimeters. Length 15 of eyelet 10 is 2.24 millimeters.

Figure 2:
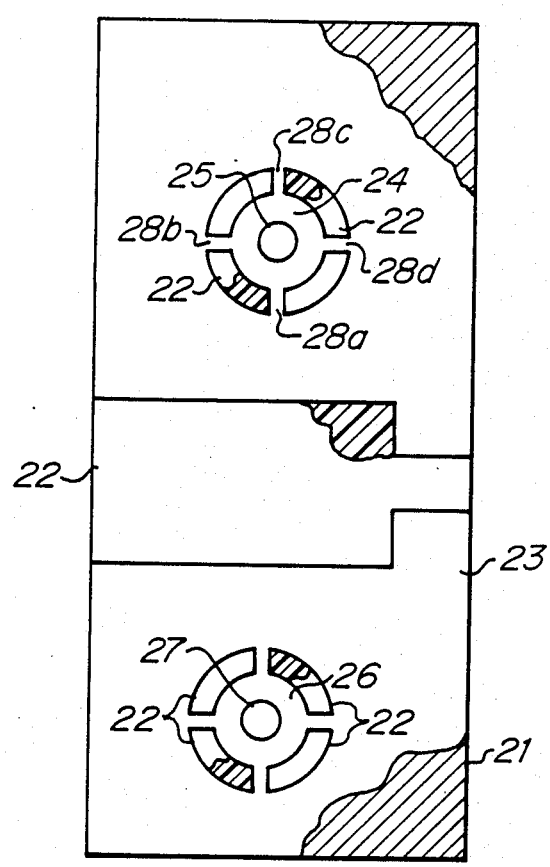
FIG. 2 shows a portion of a printed circuit board in accordance with the preferred embodiment of the present invention.

In FIG. 2 is shown a portion of a printed circuit board (PCB) 21. PCB 21 should be made out of material with a low thermal coefficient of expansion, e.g., epoxy glass material. For instance, Norplex, having a place of business at 1300 Norplex Drive, La Cross, Wis. 64601, sells a copper clad epoxy base laminate printed circuit board material which is called CEM 3 (product Number NP525).

Placed on top of PCB 21 is a copper layer 23. Through PCB 21 is a hole 25 and a hole 27. Hole 25 and hole 27 are for eyelets such as eyelet 10. The diameter of hole 25 and hole 27 is 1.85 mm. Copper layer 23 has been removed in portions to expose an insulated layer 22. The removal of copper layer 23 has left a copper pad 24 around hole 25 and a copper pad 26 around hole 27. Outside diameter of copper pad 24 and copper pad 26 is 3.2 mm.

Copper pad 24 and copper pad 26 are coupled to the remainder of copper layer 23 through spokes. For instance, copper pad 24 is connected to the remainder of copper layer 23 through a spoke 28a, a spoke 28b, a spoke 28c and a spoke 28d. Spokes 28a, 28b, 28c and 28d are part of copper layer 23. Each are approximately 0.3 mm wide and extend a distance of 0.5 mm from copper pad 24 to the rest of copper layer 23.

Copper pad 24 and copper pad 26 are thermally isolated dfrom the rest of copper layer 23 in order to conserve heat to the area where eyelets are soldered.

Figure 4:
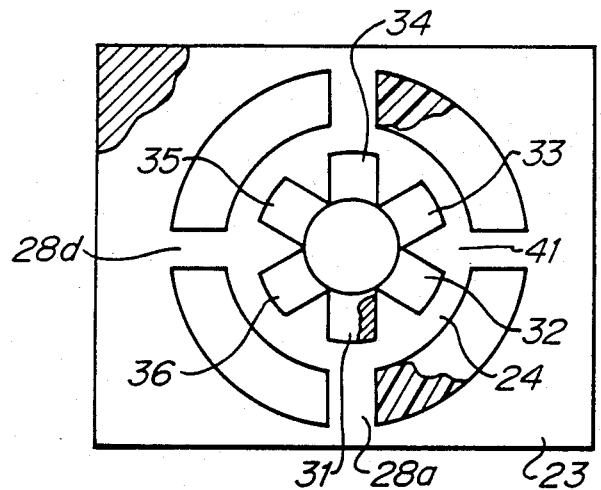
FIG. 4 is another view of the eyelet shown in FIG. 1, placed in the circuit board shown in FIG. 2.

FIG. 3 shows eyelet 10 placed through hole 25 of PCB 21. After being placed through hole 25, eyelet 10 has been crimped to mechanically fasten eyelet 10 within hole 25. Tabs 31, 32, 33, 34, 35 and 36 provide mechanical and electrical connection between copper pad 24 and eyelet 10. Tabs 34, 35 and 36 and copper pad 24 are shown in FIG. 4. Eyelet 10 is not crimped flat, but is rolled. If eyelte 10 is crimped too flat, solder will stay on tabs 31, 32, 33, 34, 35 and 36, and not flow onto copper pad 24. Additionally, the shape of the space between each of tabs 31–36 needs to be such as to provde capillary flow of solder out onto copper pad 24. Further, eyelet 10 is crimped so that under its own weight, eyelet 10 is able to move slightly in and out of hole 25 without falling out, and slightly horizontally, back and forth across copper pad 24. The maximum vertical movement and the maximum horizontal movement is approximately 0.25 millimeters. Typically, the crimping is done so that a maximum torque of 250 grams per millimeter is required to rotate eyelet 10 in hole 25.

FIG. 4 shows a bird's eye view of eyelet 10 placed through hole 25. As can be seen tabs 31-36 are shown making mechanical electrical contact with copper pad 24. A hole 41 through eyelet 10 allows solder to flow from the bottom of PCB 21, over and between tabs 31-36 onto copper pad 24.

Figure 5:
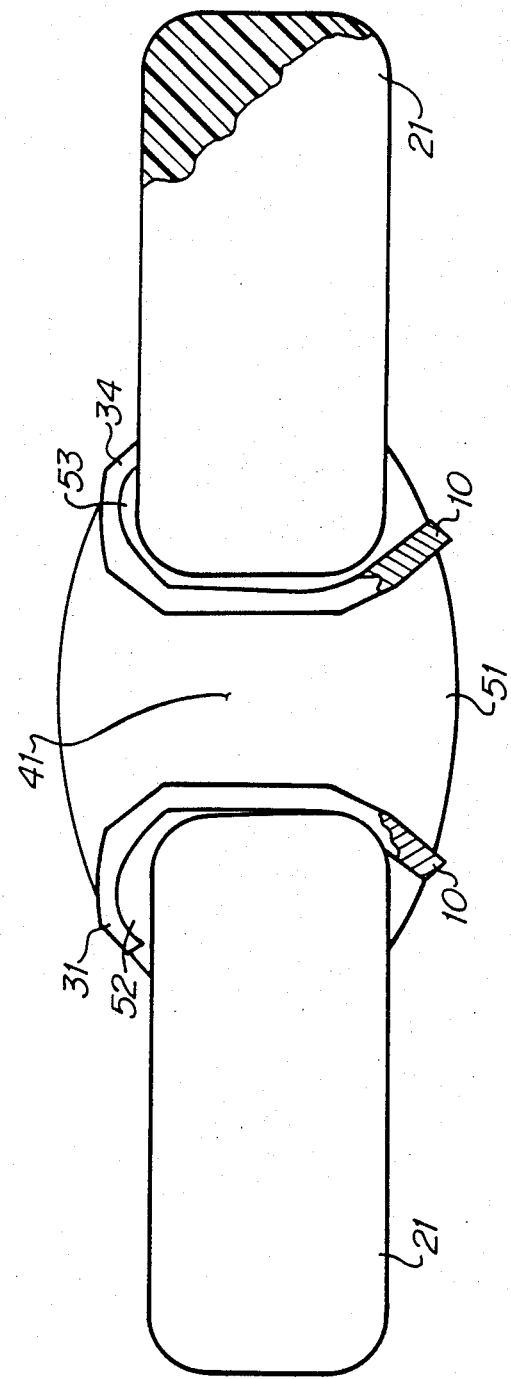
FIG. 5 is a cross-sectional view of the eyelet shown in FIG. 1 after it has been soldered in place in the circuit board shown in FIG. 2.

FIG. 5 shows a cross-section view through the middle of hole 25 after eyelet 10 has been soldered into place by solder 51. Wave soldering is used to solder eyelet 10. A flux that is not an organic acid flux is used in wave soldering in order to assure that the soldered joint is later not subject to corrosion. The wave soldering is done on the bottom of PCB 21. Solder masks are used to cover portions of the bottom of PCB 21 which are not to be soldered. The solder is heated to approximately 470 degrees Fahrenheit. The top of PCB 21 is heated to about 220 degrees Fahrenheit. Solder wave height should be no less than one third the thickness of PCB 21 in order to insure that solder will flow through hole 41 of eyelet 10, over and between tabs 31-36 onto copper pad 24. As can be seen from FIG. 5, an area 52 under tab 31 and an area 53 under tab 34 has received solder, making a well soldered joint. If the joint is not well-soldered, as PCB 21 cools following the soldering, thermal contraction of the thickness of PCB 21 will cause the soldered joint to crack.

We claim:

1. A method for providing an electrical connection between a bottom and a top of a printed circuit board, the method comprising the steps of:
   (a) isolating a first portion of conductive layer on top of the printed circuit board and around a hole in he printed circuit board, so that when soldering, heat may be conserved in the first portion;
   (b) inserting an eyelet through the hole;
   (c) crimping the eyelet so that tabs of the eyelet cause the eyelet to be mechanically retained in the hole, so that capillary solder paths to the copper pad are formed, and so that the eyelet is crimped with such a tension that under its own weight the eyelet is able to non-resiliently move slightly in and out of the hole and the eyelet is able to move slightly in a horizontal motion across the first portion of the conductive layer;
   (d) wave soldering the bottom of the printed circuit board.

2. A method as in claim 1 wherin step (a) comprises the substep:
   (a1) removing sections of the conductive layer around the first portion of the conductive layer, so that the first portion of the conductive layer is coupled to the rest of the conductive layer through a plurality of spokes.

3. A method as in claim 1 wherein in step (c) the eyelet is crimped such that the tabs are curved and the tabs engage but do not lie flat upon the first portion of the conductive layer.

4. A method as in claim 1 wherein the eyelet is able to move a maximum of 0.25 millimeters across the first portion of the conductive layer and a maximum of 0.25 millimeters vertically, in and out of the hole.

5. A method for providing an electrical connection between a bottom and a top of a printed circuit board, the method comprising the steps of:
   (a) creating a hole in the printed circuit board;
   (b) inserting an eyelet through the hole;
   (c) crimping the eyelet so that tabs of the eyelet cause the eyeelt to be mechanically retained in the hole, so that the tabs are curved, so that the tabs engage but tdo not lie flat upon a conductive layer on the bottom of the printed circuit board and so that the eyelet is crimped with such a tension that under the eyelet's own weight the eyelet is able to non-resiliently make slight vertical motion in and out of the hole, and the eyelet is able to move slightly in a horizontal motion across the conductive layer; and,
   (d) wave soldering th bottom of the printed circuit board.

6. A method as in claim 6 wherein the eyelet is able to move a maximum of 0.25 millimeters across the conductive layer and a maximum of 0.25 millimeters vertically, in and out of the hole.

* * * * *

UNITED STATES PATENT AND TRADEMARK OFFICE
CERTIFICATE OF CORRECTION

PATENT NO. : 4,881,906

DATED : November 21, 1989

INVENTOR(S) : James C. Mackanic; Dawn M. Lelko; Steven A. Shugart; James K. Koch It is certified that error appears in the above-identified patent and that said Letters Patent is hereby corrected as shown below:

Column 1, line 7, "withproviding" should read -- with providing --

Column 1, line 8, "betweenthe" should read -- between the --

Column 1, line 24, "t hrough" should read -- through --

Column 1, line 32, insert -- to the top side, allow the soldering of both sides of an --

Column 1, line 34, "eyelets" should read -- eyelet --

Column 1, line 35, "mechanicalconnection" should read -- mechanical connection --

Column 1, line 38, "tmperature" should read -- temperature --

Column 1, line 44, "betwee" should read -- between --

Column 1, line 54, "isolatio" should read -- isolation --

Column 2, line 18, "fstner" should read -- fastener --

Column 2, line 23, "07616" should read -- 06716 --

Column 2, line 25, "Length 4" should read -- Length 14 --

Column 2, line 62, "eyelte" should read -- eyelet --

Column 2, line 66, "provde" should read -- provide --

Column 3, line 3, "andthe" should read -- and the --

Column 4, line 9, "wherin" should read -- wherein --

UNITED STATES PATENT AND TRADEMARK OFFICE
CERTIFICATE OF CORRECTION

PATENT NO. : 4,881,906

DATED : November 21, 1989

INVENTOR(S) : James C. Mackanic; Dawn M. Lelko; Steven A. Shugart; James K. Koch It is certified that error appears in the above-identified patent and that said Letters Patent is hereby corrected as shown below:

Column 4, line 30, "eyeelt" should read -- eyelet --

Column 4, line 32, "but tdo" should read -- but do --

Column 4, line 41, "claim 6" should read -- claim 5 --

Signed and Sealed this

Eighteenth Day of December, 1990

*Attest:*

HARRY F. MANBECK, JR.

*Attesting Officer*  *Commissioner of Patents and Trademarks*